(12) United States Patent
Kambara

(10) Patent No.: US 6,902,782 B2
(45) Date of Patent: Jun. 7, 2005

(54) DEVICE PACKAGING TAPE WITH ANTISTATIC TREATMENT

(75) Inventor: Shigeru Kambara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 46 days.

(21) Appl. No.: 10/438,728

(22) Filed: May 14, 2003

(65) Prior Publication Data

US 2003/0215590 A1 Nov. 20, 2003

(30) Foreign Application Priority Data

May 16, 2002 (JP) ........................................ 2002-141214

(51) Int. Cl.[7] .................................................. B32B 1/02
(52) U.S. Cl. ...................... 428/34.2; 428/349; 428/393; 428/511; 428/514; 428/537.5
(58) Field of Search ................................ 428/34.2, 349, 428/393, 511, 514, 537.5

(56) References Cited

U.S. PATENT DOCUMENTS 4,097,649 A  *  6/1978  Neumann .................... 428/327

FOREIGN PATENT DOCUMENTS

| JP | 6-331 533 | 12/1994 |
|---|---|---|
| JP | 11-165786 | 6/1996 |

* cited by examiner

*Primary Examiner*—Sandra M. Nolan
(74) *Attorney, Agent, or Firm*—Hamre, Schumann, Mueller & Larson, P.C.

(57) ABSTRACT

A packaging tape includes a carrier tape and a top tape. The carrier tape is provided with device-accommodating recesses. The top tape is attached to the carrier tape by heat-sealing to close the device-accommodating recesses. The carrier tape includes a resin layer made by impregnation and drying of a water-dispersible resin or a water-soluble resin or both. The top tape is attached to the resin layer of the carrier tape. This prevents the generation of static electricity on the top tape as the top tape is peeled off the carrier tape. Accordingly, the unscheduled removal of electronic devices from the device-accommodating recesses by the static electricity is avoided.

3 Claims, 2 Drawing Sheets

PRIOR ART

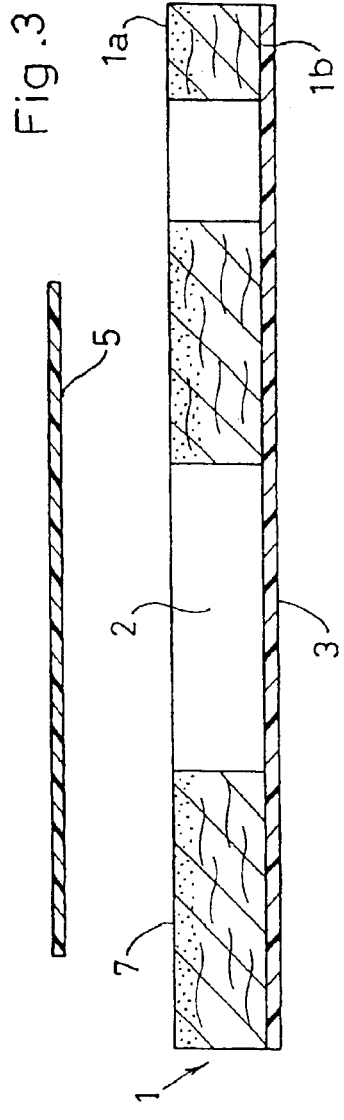
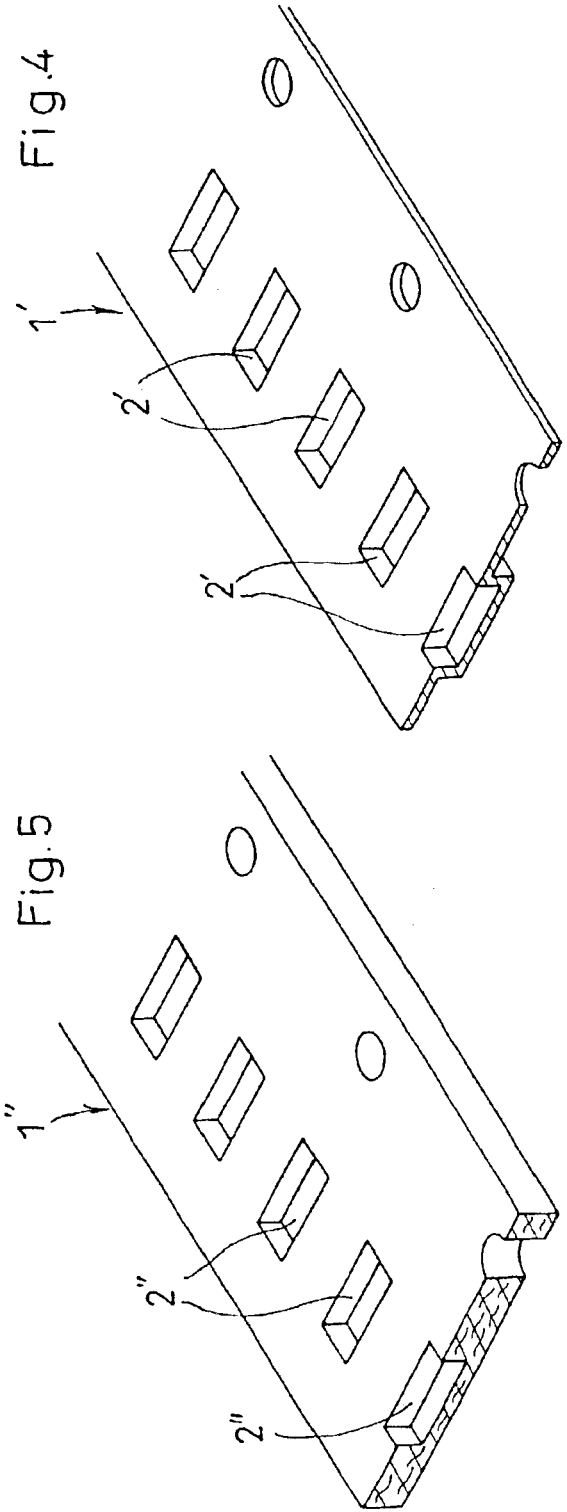

DEVICE PACKAGING TAPE WITH ANTISTATIC TREATMENT

BACKGROUND OF THE INVENTION

1. Field of the Invention

The present invention relates to a device packaging tape that comprises a paper-made carrier tape and a resin-made, heat-sealing top tape for covering device pockets formed in the carrier tape to accommodate electronic devices such as chip resistors.

2. Description of the Related Art

Conventional packaging tapes for transporting electronic devices are disclosed in Japanese Patent Laid-open No. 6(1994)-331533 and No. 11(1999)-165786, for example. These packaging tapes, as shown in FIGS. 1 and 2 of the present application, include a thick, paper-made carrier tape 1 provided with a number of device-accommodating pockets 2 arranged at prescribed intervals longitudinally of the tape. The packaging tape also includes a bottom tape 3 and a top tape 5. The bottom tape 3, made of synthetic resin such as polyethylene, is stuck to the reverse side of the carrier tape 1. In a device-loading process, the carrier tape 1, with the bottom tape 3 attached thereto, is forwarded longitudinally (see the arrow in FIG. 1). In this state, electronic devices 4 are put into the pockets 2 of the carrier tape 1. Thereafter, the top tape 5 is attached to the obverse side of the carrier tape 1 for sealing the device-loaded pockets 2.

In the conventional packaging tape, the top tape 5 may be made of a thermoplastic synthetic resin such as polyethylene for enabling thermal adhesion to the carrier tape 1. As another option, the top tape 5 can be made of a non-thermoplastic resin, but applied with hot-melt adhesive on one side thereof. In either way, when pressed against the carrier tape 1 by heated presser rollers 6, as shown in FIGS. 1 and 2, the compressed parts of the top tape 5 become sticky and will be firmly attached to the carrier tape 1 as they cool down.

The conventional method, however, has the following drawback.

As noted above, the top tape 5 is pressed against the carrier tape 1 by the heated presser rollers 6 for attachment. In this process, the thermally melted resin parts of the top tape 5 (or applied adhesive) inundate paper fibers on the surface of the carrier tape 1. Then, the melted parts of the top tape 5 will be hardened, thereby trapping the paper fibers of the carrier tape 1. In this condition, when the top tape 5 is peeled off to take out the inside devices, some of the trapped paper fibers may be nipped out from the carrier tape 1, while the other may remain on the carrier tape 1 by slipping away from the trap of the top tape 5. In this latter case, the slipping paper fibers are rubbed with the trapping portions of the resin-made top tape 5. Consequently, static electricity is generated on the top tape 5, whereby the electronic devices accommodated in the device pockets 2 tend to be attracted to the top tape 5 to be peeled. Unfavorably, this may result in the loss of the electronic devices.

SUMMARY OF THE INVENTION

The present invention has been proposed under the circumstances described above. It is, therefore, an object of the present invention to provide a technique for preventing the above-described static electricity generation on the top tape of an electronic device packaging tape.

According to a first aspect of the present invention, there is provided a packaging tape comprising: a carrier tape made of paper and provided with a plurality of device-accommodating recesses; and a top tape attached to the carrier tape by heat-sealing for closing the respective device-accommodating recesses. The carrier tape includes an obverse surface to which the top tape is attached. Also, the carrier tape includes a resin layer formed by impregnation of a water-dispersible resin with respect to the obverse surface of the carrier tape and drying the water-dispersible resin.

Examples of the water-dispersible resin are polyacrylic ester resin or styrene acrylic resin, with which an emulsion or an aqueous solution can be prepared. To perform the required impregnation, the polyacrylic ester resin or the styrene acrylic resin may be used alone, or the mixture of them may be used.

According to a second aspect of the present invention, there is provided a packaging tape comprising: a carrier tape made of paper and provided with a plurality of device-accommodating recesses; and a top tape attached to the carrier tape by heat-sealing for closing the respective device-accommodating recesses. The carrier tape includes an obverse surface to which the top tape is attached. Also, the carrier tape includes a resin layer formed by impregnation of a water-soluble resin with respect to the obverse surface of the carrier tape and drying the water-soluble resin.

Examples of the water-soluble resin are polyvinyl alcohol, carboxymethyl cellulose, chitosan, starch, and water-soluble polyester. To perform the required impregnation, one of these materials may be used alone, or the mixture of at least two of them may be used.

According to a third aspect of the present invention, there is provided a packaging tape comprising: a carrier tape made of paper and provided with a plurality of device-accommodating recesses; and a top tape attached to the carrier tape by heat-sealing for closing the respective device-accommodating recesses. The carrier tape includes an obverse surface to which the top tape is attached. Also, the carrier tape includes a resin layer formed by impregnation of a mixture of a water-dispersible resin and a water-soluble resin with respect to the obverse surface of the carrier tape and then drying the mixture.

Other features and advantages of the present invention will become apparent from the detailed description given below with reference to the accompanying drawings.

BRIEF DESCRIPTION OF THE DRAWINGS

FIG. 3 is a sectional view showing an electronic device packaging tape according to a first embodiment of the present invention;

FIG. 4 is a perspective view showing a carrier tape used for a device packaging tape according to a second embodiment of the present invention; and FIG. 5 is a perspective view showing a carrier tape used for a device packaging tape according to a third embodiment of the present invention.

DETAILED DESCRIPTION OF THE PREFERRED EMBODIMENTS

Preferred embodiments of the present invention will be described below with reference to the accompanying drawings.

Reference is first made to FIG. 3 showing in section an electronic device packaging tape according to a first embodiment of the present invention.

Numeral 1 in FIG. 3 refers to a carrier tape.

Likewise to the previously described conventional counterpart, the carrier tape 1 of the present invention is made of paper, having an appropriate thickness for safely accommodating electronic devices to be transported. The carrier tape 1 is provided with a plurality of device-accommodating pockets 2 arranged in a row, at prescribed pitches, longitudinally of the tape 1. The carrier tape 1 has a bottom surface 1b to which a bottom tape 3 is stuck. The bottom tape 3, which is a film made of a synthetic resin (e.g. polyethylene), closes the downwardly open, rectangular through-holes to provide the above-mentioned pockets 2.

Figure 1:
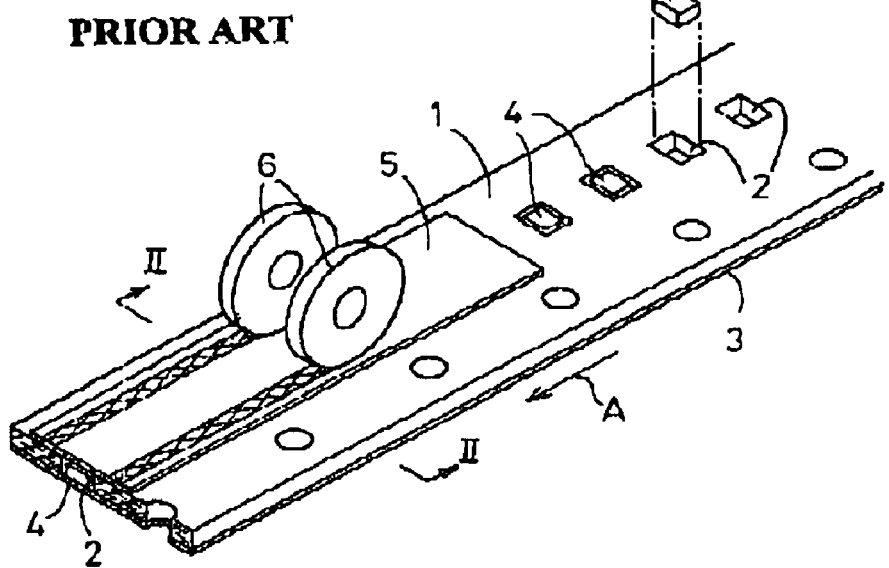
FIG. 1 is a perspective view showing a conventional packaging tape for transporting electronic devices.
Figure 2:
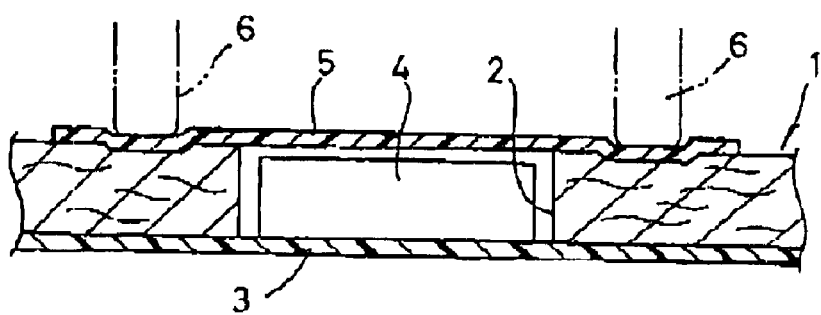
FIG. 2 is a sectional view taken along lines II—II in FIG. 1.

Electronic devices to be transported are put into the pockets 2, typically one device for one pocket. Thereafter, a top tape 5 is placed over the obverse surface 1a of the carrier tape 1. The top tape 5 may be made of a thermoplastic resin such as polyethylene, so that relevant parts of the top tape itself can be thermally melted to be attached to the carrier tape 1. As an alternative, a hot-melt adhesive layer may be provided on the reverse surface of the top tape 5. In this case, the top tape 5 itself does not need to be made of a thermoplastic resin. The top tape 5 stacked on the carrier tape 1 can be fixed to the carrier tape 1 in the same way as described with reference to FIGS. 1 and 2, by using a pair of heated presser rollers (see numeral 6 in FIGS. 1, 2). While being held in pressing contact with the top tape 5, the presser rollers are moved longitudinally of the carrier tape 1 so that they flank each of the device pockets (numeral 2) sequentially along the way. In this manner, the compressed portions of the top tape 5 (or of the additional hot-melt adhesive layer) are fixed to the carrier tape 1.

Some of technically significant features of the packaging tape according to the present invention may reside in the following points.

In the conventional device packaging tape, the carrier tape is made of paper and subjected to no special treatment. Because of this, static electricity is generated in the top tape being peeled off the carrier tape, whereby the electronic devices accommodated in the device pockets are likely to suffer unscheduled evacuation. As opposed to this, the carrier tape 1 of the present invention is subjected to a resin-impregnating treatment (to be described below) before the top tape 5 is attached, so that no detrimental static electricity will be generated in the top tape 5 to be peeled off the carrier tape 1.

Specifically, before the top tape 5 is attached to the carrier tape 1, a surface 1a of the carrier tape 1 is impregnated with a water-dispersible resin (or more than one kind of resin), so that a resin layer 7, as shown in FIG. 3, is formed in the carrier tape 1.

The resin material to be used for this purpose may be provided in the form of an emulsion composed of water and resin such as polyacrylic ester resin or styrene acrylic resin. Alternatively, the resin material for the impregnation may be provided in the form of a water solution (disperse system), in which the above-mentioned polyacrylic ester resin or styrene acrylic resin is dispersed. The prepared emulsion or disperse system may be applied to the surface 1a of the carrier tape 1 by a known technique (e.g. spraying). Before the application, the originally obtained emulsion or disperse system can be diluted by water. After an appropriate amount of emulsion or disperse system is applied, it is dried to form the resin layer 7.

The carrier tape 1 may be obtained by cutting a thick paper board into the desired elongated form. In this case, the resin layer 7 of the carrier tape 1 can be provided by resinating the corresponding part of the paper board. Specifically, a paper board is composed of a stack of paper layers each of which is produced by a known pulp-screening process. Some of the paper layers correspond to the non-resinated portion of the desired carrier tape 1, while the remaining layers correspond to the resin layer 7 of the tape. To produce the remaining layers, the water-dispersible resin or resins mentioned above are added to the slurry of paper pulp. Accordingly, the resultant paper board is resinated partially.

The provision of the resin layer 7 in the carrier tape 1 has the following advantage.

The water-dispersible resin applied for making the resin layer 7 has very low resistance to heat. Accordingly, though the resin layer 7 is strong enough to hold together the surface paper fibers of the carrier tape 1 at room temperature, the mechanical strength of the layer 7 deteriorates once the layer 7 is heated up by the presser rollers 6. Due to this, when the top tape 5 thermally attached to the carrier tape 1 (precisely, to the resin layer 7) is peeled off the tape 1, the paper fibers trapped in the melted resin portions of the top tape 5 can be readily plucked off the resin layer 7 whose mechanical biding force has been weakened. In this case, no relative movement occurs between the trapped paper fibers and the relevant parts of the top tape 5, whereby the unfavorable static electricity as in the prior art tape is not generated.

In the above-described embodiment, a water-dispersible resin, such as polyacrylic ester resin and styrene acrylic resin, is used for making the resin layer 7. According to the present invention, other kinds of resin materials having the same or similar properties can be used in place of the water-dispersible resins. Examples of substitutes are polyvinyl alcohol, carboxymethyl cellulose, chitosan, starch, and water-soluble polyester.

FIG. 4 shows a carrier tape 1' used for making a device packaging tape according to a second embodiment of the present invention. The carrier tape 1', having a smaller thickness than the carrier tape 1 of the first embodiment, is embossed to provide a plurality of device pockets 2'. In this case, a bottom tape (see numeral 3 in FIG. 3) is not necessary. Though not shown in the figure, the obverse surface of the carrier tape 1' is subjected to a resinating treatment as described above with respect to the first embodiment.

FIG. 5 shows a carrier tape 1" used for making a device packaging tape according to a third embodiment of the present invention. The carrier tape 1" may have the same or greater thickness than the carrier tape 1 of the first embodiment. The obverse surface of the carrier tape 1" is subjected to a resinating treatment, as in the first embodiment. The device pockets 2" may be formed by pressworking.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A packaging tape comprising:
    a carrier tape made of paper and provided with a plurality of device-accommodating recesses; and
    a heat-sealable top tape attached to a surface of the carrier tape by heat-sealing for closing the respective device-accommodating recesses;
    wherein the carrier tape contains paper fibers,
    at least a portion of the paper fibers located adjacent to the surface of the carrier tape is impregnated with a water-dispersible resin, and paper fibers trapped by the top tape are allowed to come off the carrier tape together with the top tape when the top tape is peeled off the carrier tape.

2. A packaging tape comprising:

a carrier tape made of paper and provided with a plurality of device-accommodating recesses; and a heat-sealable top tape attached to a surface of the carrier tape by heat-sealing for closing the respective device-accommodating recesses;

wherein the carrier tape contains paper fibers, at least a portion of the paper fibers located adjacent to the surface of the carrier tape is impregnated with a water-soluble resin, and paper fibers trapped by the top tape are allowed to come off the carrier tape together with the top tape when the top tape is peeled off the carrier tape.

3. A packaging tape comprising:

a carrier tape made of paper and provided with a plurality of device-accommodating recesses; and a heat-sealable top tape attached to a surface of the carrier tape by heat-sealing for closing the respective device-accommodating recesses;

wherein the carrier tape contains paper fibers, at least a portion of the paper fibers located adjacent to the surface of the carrier tape is impregnated with a mixture of a water-dispersible resin and a water-soluble resin, and paper fibers trapped by the top tape are allowed to come off the carrier tape together with the top tape when the top tape is peeled off the carrier tape.

* * * * *